United States Patent
Shiratori et al.

(10) Patent No.: US 12,197,115 B2
(45) Date of Patent: Jan. 14, 2025

(54) WAVELENGTH CONVERSION ELEMENT, ILLUMINATION DEVICE, AND PROJECTOR

(71) Applicant: SEIKO EPSON CORPORATION, Tokyo (JP)

(72) Inventors: Koya Shiratori, Matsumoto (JP); Mizuha Hiroki, Zama (JP); Tetsuo Shimizu, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 340 days.

(21) Appl. No.: 17/698,606

(22) Filed: Mar. 18, 2022

(65) Prior Publication Data

US 2022/0299855 A1 Sep. 22, 2022

(30) Foreign Application Priority Data

Mar. 19, 2021 (JP) ................. 2021-045364

(51) Int. Cl.
*G03B 21/20* (2006.01)
*H01L 33/50* (2010.01)
*H01L 33/60* (2010.01)

(52) U.S. Cl.
CPC ....... *G03B 21/204* (2013.01); *G03B 21/2066* (2013.01); *G03B 21/208* (2013.01);
(Continued)

(58) Field of Classification Search
CPC .......... G03B 21/204; G03B 21/2066; G03B 21/208; G03B 21/206; H01L 33/505; H01L 33/507; H01L 33/60; H01L 2933/0091; H01L 33/502; H01L 33/10–105; H01L 33/46–465; H10K 50/80–856; H10K 59/875–878

See application file for complete search history.

(56) References Cited

U.S. PATENT DOCUMENTS

2007/0053065 A1 3/2007 Nagao
2014/0268063 A1 9/2014 Akiyama et al.
(Continued)

FOREIGN PATENT DOCUMENTS

CN 103838068 A 6/2014
JP H07-056013 A 3/1995
(Continued)

*Primary Examiner* — Sonya McCall-Shepard
(74) *Attorney, Agent, or Firm* — Oliff PLC

(57) ABSTRACT

A wavelength conversion element includes a substrate, reflection layer on the substrate, wavelength conversion layer in the reflection layer and converting a light in a first wavelength range into a light in a second wavelength range, structure in the wavelength conversion layer and scattering a part of the light in the first wavelength range, and optical layer in the structure, reflecting a part of the light in the first wavelength range, transmitting another part of the light in the first wavelength range, and transmitting the light in the second wavelength range. The structure includes a first structure portion, second structure portion, and planar portion between the first and second structure portions, the optical layers in the first and second structure portions have first reflectance for the light in the first wavelength range, and the optical layer in the planar portion has second reflectance.

10 Claims, 7 Drawing Sheets

(52) U.S. Cl.
CPC .......... *H01L 33/505* (2013.01); *H01L 33/507* (2013.01); *H01L 33/60* (2013.01)

(56) References Cited

U.S. PATENT DOCUMENTS

| | | | |
|---|---|---|---|
| 2017/0192129 A1* | 7/2017 | Cunningham | ......... C09K 11/02 |
| 2019/0271907 A1 | 9/2019 | Akiyama | |
| 2020/0049323 A1* | 2/2020 | Arakawa | .................. G02B 5/26 |
| 2021/0294192 A1 | 9/2021 | Shiratori et al. | |

FOREIGN PATENT DOCUMENTS

| | | |
|---|---|---|
| JP | 2007-071976 A | 3/2007 |
| JP | 2009-122416 A | 6/2009 |
| JP | 2014-199401 A | 10/2014 |
| JP | 2017-194523 A | 10/2017 |
| JP | 2017-215549 A | 12/2017 |
| JP | 2019-152752 A | 9/2019 |
| JP | 2021-149040 A | 9/2021 |

* cited by examiner

WAVELENGTH CONVERSION ELEMENT, ILLUMINATION DEVICE, AND PROJECTOR

The present application is based on, and claims priority from JP Application Serial Number 2021-045364, filed Mar. 19, 2021, the disclosure of which is hereby incorporated by reference herein in its entirety.

BACKGROUND

1. Technical Field

The present disclosure relates to a wavelength conversion element, an illumination device, and a projector.

2. Related Art

In related art, there is an illumination device that scatters and reflects a part of a light having a first wavelength by a light diffusion surface provided on a surface of a wavelength conversion layer, combining a fluorescent light having a second wavelength formed by wavelength conversion of the first-wavelength light entering the wavelength conversion layer and the scatter-reflected first-wavelength light, and outputs a white illumination light (for example, see JP-A-2017-215549 and JP-A-2017-194523).

However, in the illumination device, the scattering angle of the first-wavelength light is not sufficient and control of scatter characteristics has room to improve, and it is hard to efficiently extract the first-wavelength light as an illumination light. There is a problem of lower light use efficiency.

SUMMARY

A first aspect of the present disclosure provides a wavelength conversion element including a substrate, a reflection layer provided on the substrate, a wavelength conversion layer provided in the reflection layer and converting a light in a first wavelength range into a light in a second wavelength range different from the first wavelength range, a structure provided in the wavelength conversion layer and scattering a part of the light in the first wavelength range, and an optical layer provided in the structure, reflecting a part of the light in the first wavelength range, transmitting another part of the light in the first wavelength range, and transmitting the light in the second wavelength range, wherein the structure includes a first structure portion, a second structure portion, and a planar portion provided between the first structure portion and the second structure portion, the optical layers provided in the first structure portion and the second structure portion have first reflectance for the light in the first wavelength range, and the optical layer provided in the planar portion has second reflectance different from the first reflectance for the light in the first wavelength range.

A second aspect of the present disclosure provides an illumination device including the wavelength conversion element according to the first aspect, a light source outputting the light in the first wavelength range, and a reflection member reflecting the light in the first wavelength range output from the light source toward the wavelength conversion element.

A third aspect of the present disclosure provides a projector including the illumination device according to the second aspect of the present disclosure, a light modulation device modulating the light from the illumination device according to image information, and a projection optical device projecting the light modulated by the light modulation device.

DESCRIPTION OF EXEMPLARY EMBODIMENTS

As below, one embodiment of the present disclosure will be explained using the drawings.

A projector of the embodiment is an example of a projector using a liquid crystal panel as a light modulation device.

Note that, to facilitate visualization of the respective component elements in the following respective drawings, scales of the dimensions may be varied depending on the component elements.

Figure 1:
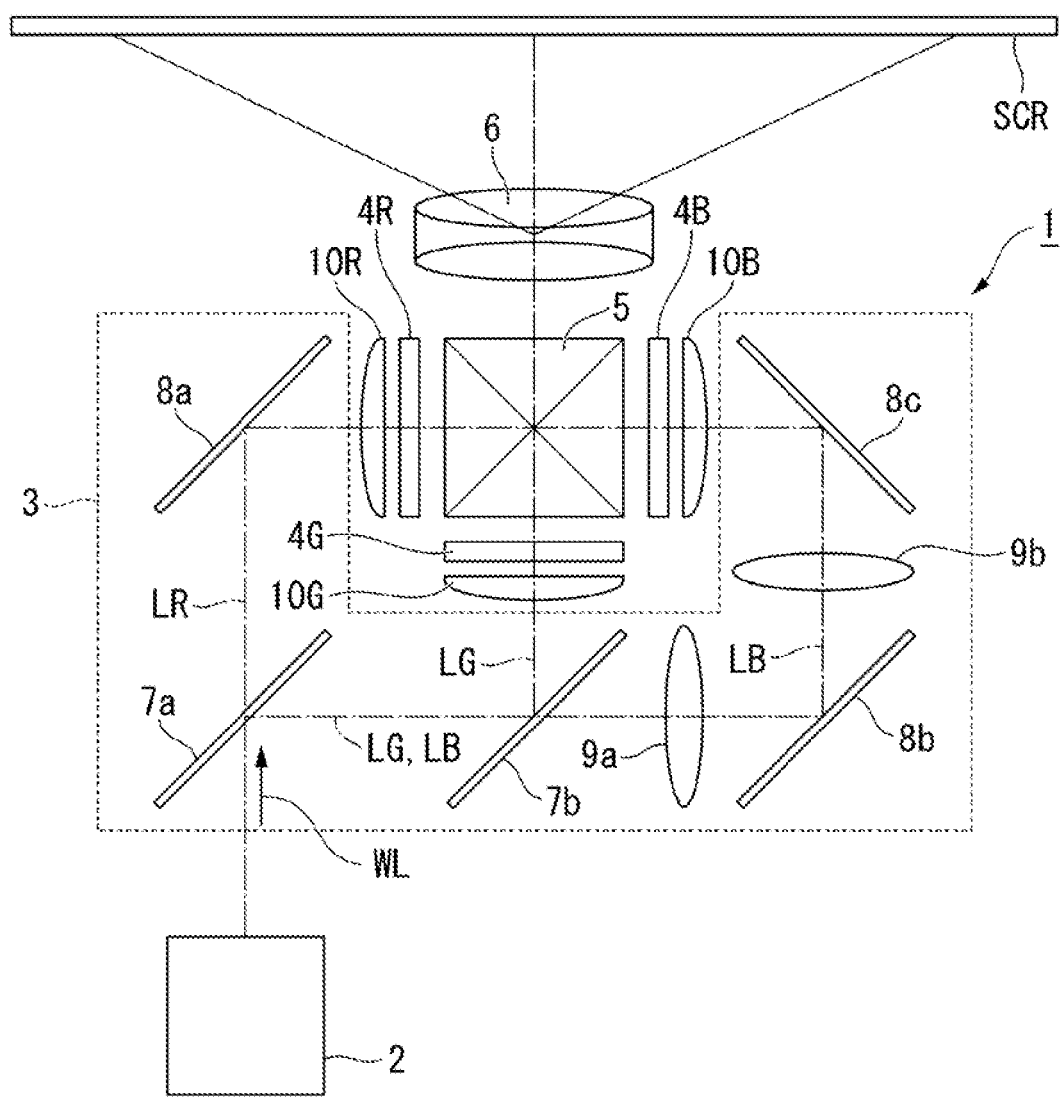
FIG. 1 shows a configuration of a projector of an embodiment.

FIG. 1 shows a configuration of the projector of the embodiment.

A projector 1 of the embodiment shown in FIG. 1 is a projection image display apparatus that displays a color image on a screen (projected surface) SCR. The projector 1 uses three light modulation devices corresponding to respective color lights of a red light LR, a green light LG, and a blue light LB.

The projector 1 includes an illumination device 2, a color separation system 3, a light modulation device 4R, a light modulation device 4G, a light modulation device 4B, a combining system 5, and a projection optical device 6.

The illumination device 2 outputs a white illumination light WL toward the color separation system 3. The color separation system 3 separates the white illumination light WL into the red light LR, the green light LG, and the blue light LB. The color separation system 3 includes a first dichroic mirror 7a, a second dichroic mirror 7b, a first reflection mirror 8a, a second reflection mirror 8b, a third reflection mirror 8c, a first relay lens 9a, and a second relay lens 9b.

The first dichroic mirror 7a separates the illumination light WL from the illumination device 2 into the red light LR and the other lights (the green light LG and the blue light LB). The first dichroic mirror 7a transmits the red light LR and reflects the other lights (the green light LG and the blue light LB). On the other hand, the second dichroic mirror 7b separates the other lights into the green light LG and the blue light LB. The second dichroic mirror 7b reflects the green light LG and transmits the blue light LB.

The first reflection mirror 8a is placed in an optical path of the red light LR and reflects the red light LR transmitted through the first dichroic mirror 7a toward the light modulation device 4R. On the other hand, the second reflection mirror 8b and the third reflection mirror 8c are placed in an optical path of the blue light LB and reflect the blue light LB transmitted through the second dichroic mirror 7b toward the light modulation device 4B. The green light LG is reflected toward the light modulation device 4G by the second dichroic mirror 7b.

The first relay lens 9a and the second relay lens 9b are placed at the light exiting side of the second dichroic mirror 7b in the optical path of the blue light LB. The first relay lens 9a and the second relay lens 9b correct differences in illumination distribution of the blue light LB due to the longer optical path length of the blue light LB than the optical path lengths of the red light LR and the green light LG.

The light modulation device 4R modulates the red light LR according to image information and forms an image light corresponding to the red light LR. The light modulation device 4G modulates the green light LG according to the image information and forms an image light corresponding to the green light LG. The light modulation device 4B modulates the blue light LB according to the image information and forms an image light corresponding to the blue light LB.

For the light modulation device 4R, the light modulation device 4G, and the light modulation device 4B, e.g. transmissive liquid crystal panels are used. Further, polarizers (not shown) are respectively placed at the light incident sides and the light exiting sides of the liquid crystal panels to pass only linearly-polarized lights in specific directions.

At the light incident sides of the light modulation device 4R, the light modulation device 4G, and the light modulation device 4B, a field lens 10R, a field lens 10G, and a field lens 10B are placed, respectively. The field lens 10R, the field lens 10G, and the field lens 10B parallelize principal rays of the red light LR, the green light LG, and the blue light LB entering the light modulation device 4R, the light modulation device 4G, and the light modulation device 4B, respectively.

The image lights enter from the light modulation device 4R, the light modulation device 4G, and the light modulation device 4B, and the combining system 5 combines the image lights corresponding to the red light LR, the green light LG, and the blue light LB and outputs the combined image light toward the projection optical device 6. For the combining system 5, e.g. a cross dichroic prism is used.

The projection optical device 6 includes a plurality of projection lenses. The projection optical device 6 enlarges and projects the image light combined by the combining system 5 toward the screen SCR. Thereby, an image is displayed on the screen SCR.

An example of the illumination device 2 of the embodiment will be explained.

Figure 2:
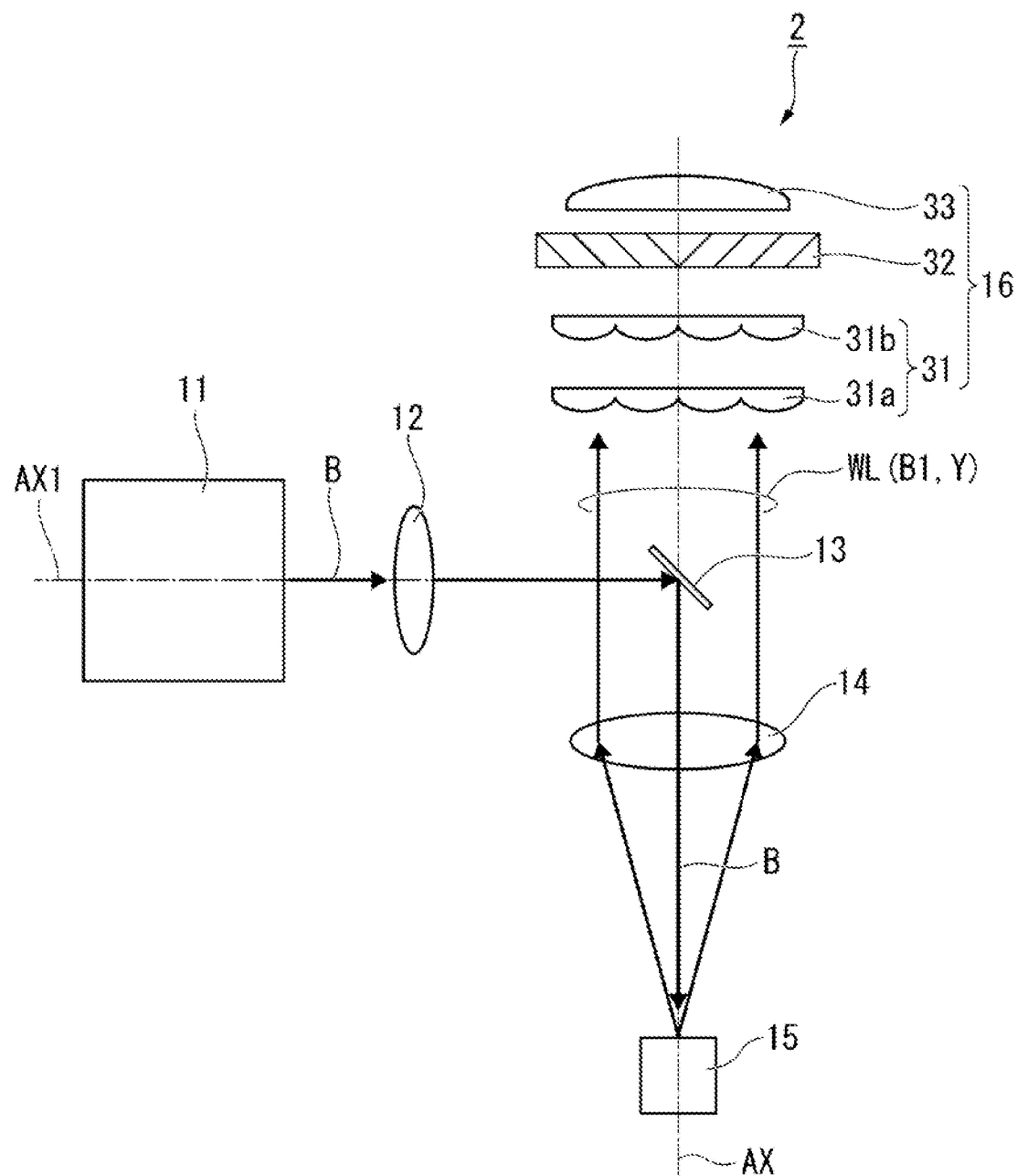
FIG. 2 shows a schematic configuration of an illumination device.

FIG. 2 shows a schematic configuration of the illumination device 2.

As shown in FIG. 2, the illumination device 2 includes a light source 11, a first optical system 12, a dichroic mirror (reflection member) 13, a second optical system 14, a wavelength conversion element 15, and a homogenizer illumination system 16. The light source 11, the first optical system 12, and the dichroic mirror 13 are placed along a light source optical axis AX1. The wavelength conversion element 15, the second optical system 14, the dichroic mirror 13, and the homogenizer illumination system 16 are placed along an illumination optical axis AX of the illumination device 2. The light source optical axis AX1 and the illumination optical axis AX are orthogonal to each other.

The light source 11 outputs a first light B. The first light B is a light having a first wavelength range. The first wavelength range of the first light B is e.g. from 450 to 460 nm and a peak wavelength of emission intensity is e.g. 455 nm. That is, the first light B is a blue light. The light source 11 includes at least one semiconductor laser. The semiconductor laser may output the first light B having another peak wavelength than 455 nm. The light source 11 includes a collimator lens (not shown) provided for the semiconductor laser. Thereby, the light source 11 converts the first light B output from the semiconductor laser into a parallel light and outputs the parallel light.

The first light B output from the light source 11 enters the first optical system 12. The first optical system 12 includes at least one convex lens and enters the collected first light B into the dichroic mirror 13.

The dichroic mirror 13 is placed near the focal point of the first optical system 12. Thereby, the first light B is collected and entered with a substantially minimized luminous flux diameter into the dichroic mirror 13. As described above, the first light B is collected and entered into the dichroic mirror 13, and thereby, the size of the dichroic mirror 13 may be reduced.

The dichroic mirror 13 has an optical property to reflect the first light B having the first wavelength range and transmit a second light Y having a second wavelength range output from the wavelength conversion element 15, which will be described later. The dichroic mirror 13 includes a dielectric multilayer film.

In the case of the embodiment, the first light B in a diverging state enters the dichroic mirror 13. The first light B reflected by the dichroic mirror 13 enters the second optical system 14. The second optical system 14 includes at least one convex lens and parallelizes the first light B entering as the diverging light. The first light B parallelized by the second optical system 14 enters the wavelength conversion element 15. That is, in the embodiment, the first light B enters the wavelength conversion element 15 as a parallel light.

Figure 3:
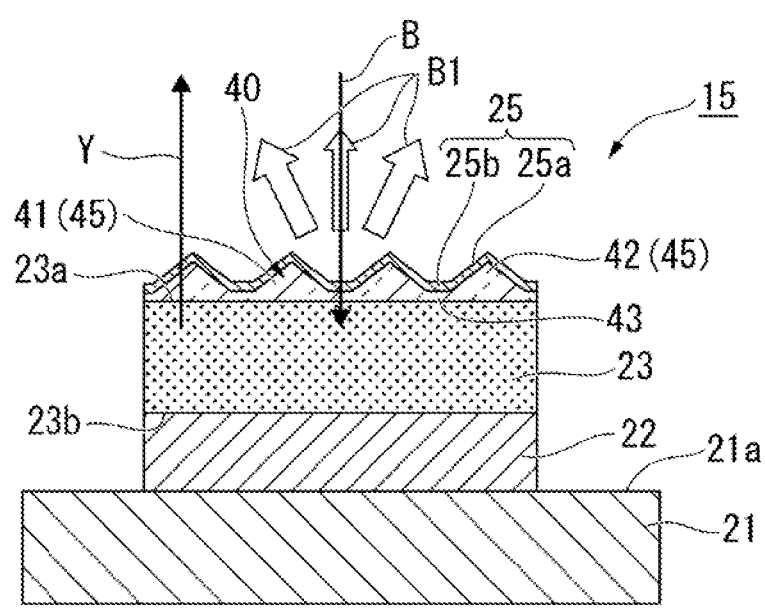
FIG. 3 is a sectional view showing a configuration of a wavelength conversion element.

FIG. 3 is a sectional view showing a configuration of the wavelength conversion element 15.

As shown in FIG. 3, the wavelength conversion element 15 includes a substrate 21, a reflection layer 22, a wavelength conversion layer 23, a structure 40, and a half mirror layer (optical layer) 25. The substrate 21 has an upper surface 21a. The substrate 21 is a supporter substrate supporting the reflection layer 22, the wavelength conversion layer 23, the structure 40, and the half mirror layer 25 and a radiator substrate radiating heat transferred from the wavelength conversion layer 23. The substrate 21 may be formed using a material having higher thermal conductivity e.g. metal, ceramics, or the like.

The reflection layer 22 is provided on the upper surface 21a of the substrate 21. That is, the reflection layer 22 is located between the substrate 21 and the wavelength conversion layer 23 and reflects the light entering from the wavelength conversion layer 23 toward the wavelength conversion layer 23 side. The reflection layer 22 is formed using a multi-layered film including a dielectric multilayer film, a metal mirror, and a high reflection coating.

The wavelength conversion layer 23 is provided on the reflection layer 22. The wavelength conversion layer 23 has an upper surface 23a that the first light B enters and a lower surface 23b different from the upper surface 23a. The wavelength conversion layer 23 converts the first light B in the first wavelength range into the second light Y having the second wavelength range different from the first wavelength range.

The wavelength conversion layer 23 may contain a ceramic fluorescent material or a single-crystal fluorescent material. The second wavelength range is e.g. from 500 to 680 nm. That is, the second light Y is a yellow light containing a green light component and a red light component.

The wavelength conversion layer 23 contains e.g. a yttrium aluminum garnet (YAG)-containing fluorescent material. YAG:Ce containing cerium (Ce) as an activator agent is taken as an example. As the wavelength conversion layer 23, a material formed by mixing and solid-phase reaction of raw material powder containing component elements including $Y_2O_3$, $Al_2O_3$, $CeO_3$ or the like, Y—Al—O amorphous particles obtained by a wet method including the coprecipitation method or the sol-gel method, YAG particles obtained by a gas-phase method including the spray drying method, the flame pyrolysis method, and the thermal plasma method, or the like may be used. Note that it is desirable to use a porous sintered compact as the wavelength conversion layer 23 in view of light use efficiency because light is scattered within the fluorescent material and the light is harder to propagate in lateral directions.

The structure 40 is provided on the upper surface 23a of the wavelength conversion layer 23 and scatters a part of the first light B. The structure 40 includes a plurality of structure portions 45 and a plurality of planar portions 43. The plurality of structure portions 45 include first structure portions 41 and second structure portions 42. The planar portions 43 are provided between the first structure portions 41 and the second structure portions 42. The first structure portion 41 and the second structure portion 42 are adjacent two structure portions of the plurality of structure portions 45.

In the case of the embodiment, the first structure portions 41 and the second structure portions 42 have quadrangular pyramid shapes. Hereinafter, when the first structure portions 41 and the second structure portions 42 are not particularly distinguished, the first structure portions 41 and the second structure portions 42 are simply referred to as "structure portions 45".

In the embodiment, the structure 40 is separately formed from the wavelength conversion layer 23. For the structure 40 of the embodiment, e.g. a technique of forming a dielectric material using the evaporation method, the sputtering method, the CVD method, the coating method, or the like, and then, processing using photolithography is suitable. Alternatively, the printing method including nanoimprint or the transfer method may be used. It is preferable to form the structure 40 using a material having lower light absorption and chemical stability. That is, the structure 40 is formed using a material having a refractive index in a range from 1.3 to 2.5 e.g. $SiO_2$, SiON, $TiO_2$, or the like. For example, when the structure 40 is formed using $SiO_2$, the structure can be processed with higher accuracy by wet or dry etching.

The half mirror layer 25 is provided on the structure 40, and reflects apart of the first light B, transmits another part of the first light B, and transmits the second light Y. Regarding the reflectance of the half mirror layer 25, the reflectance and the wavelength characteristics can be designed at a higher degree of freedom by the material and the layer configuration. The half mirror layer 25 covers the structure portions 45 and the planar portions 43.

The half mirror layer 25 of the embodiment is formed using a dielectric multilayer film for suppressing light absorption. The material used for the dielectric multilayer film is a chemically stable material used in general. For example, one of $MgF_2$, $SiO_2$, $Al_2O_3$, $Y_2O_3$, $CeO_2$, $HfO_2$, $La_2O_3$, $ZrO_2$, $Ta_2O_5$, $Nb_2O_5$, and $TiO_2$ is preferable. Note that $MgF_2$, and $SiO_2$ are preferable as low-refractive-index materials, and $Al_2O_3$, $Y_2O_3$, $CeO_2$, $HfO_2$, $La_2O_3$, $ZrO_2$, $Ta_2O_5$, $Nb_2O_5$, and $TiO_2$ are preferable as middle to high-refractive-index materials. The half mirror layer 25 of the embodiment is formed using e.g. a dielectric multilayer film in which multiple layers of $SiO_2$ and $TiO_2$ are alternately stacked.

The half mirror layer 25 includes a first layer 25a and a second layer 25b. The first layer 25a is a layer covering the structure portions 45 of the half mirror layer 25. The second layer 25b is a layer covering the planar portions 43 of the half mirror layer 25.

The structure 40 of the embodiment has first reflectance for the first light B in the structure portions 45 in which the first layer 25a is provided. Specifically, the first structure portions 41 and the second structure portions 42 have surfaces covered by the first layer 25a and respectively have the first reflectance for the first light B.

Further, the structure 40 of the embodiment has second reflectance different from the first reflectance for the first light B in the planar portions 43 in which the second layer 25b is provided. Specifically, the planar portions 43 have surfaces covered by the second layer 25b and have the second reflectance for the first light B. In the case of the embodiment, the first reflectance is higher than the second reflectance as will be described later.

In the embodiment, the film thickness of the first layer 25a is smaller than the film thickness of the second layer 25b. Here, the film thickness of the first layer 25a refers to a thickness in a normal direction with respect to the surface of the first structure portion 41 or the second structure portion 42, and the film thickness of the second layer 25b refers to a thickness in a normal direction with respect to the surface of the planar portion 43.

The half mirror layer 25 is formed by e.g. the evaporation method, the sputtering method, the CVD method, the coating method, or the like. The surfaces of the structure portions 45 are inclined relative to the surfaces of the planar portions 43. Accordingly, for example, using the evaporation method, as described above, the configuration in which the film thickness of the first layer 25a covering the structure portions 45 is smaller than the film thickness of the second layer 25b covering the planar portions 43 may be easily realized by the same process.

When the half mirror layer 25 is formed using the sputtering method or the CVD method, a difference in adhesion probability of the deposited particles is smaller and the film thickness distribution is smaller than those by the evaporation method, however, the half mirror layer 25 having the same reflection characteristics as those by the evaporation method may be formed by calculation of the film thickness ratios suitable for the respective devices for design and deposition. Alternatively, the half mirror layer 25 may be formed using the ALD (Atomic Layer Deposition) method. In this case, the half mirror layer 25 may be formed by design of reflection angle characteristics using the difference in incident angle to the surfaces with the films formed thereon of the structure portions 45 and the planar portions 43.

Subsequently, the optical properties of the half mirror layer 25 of the embodiment will be explained.

Figure 4A:
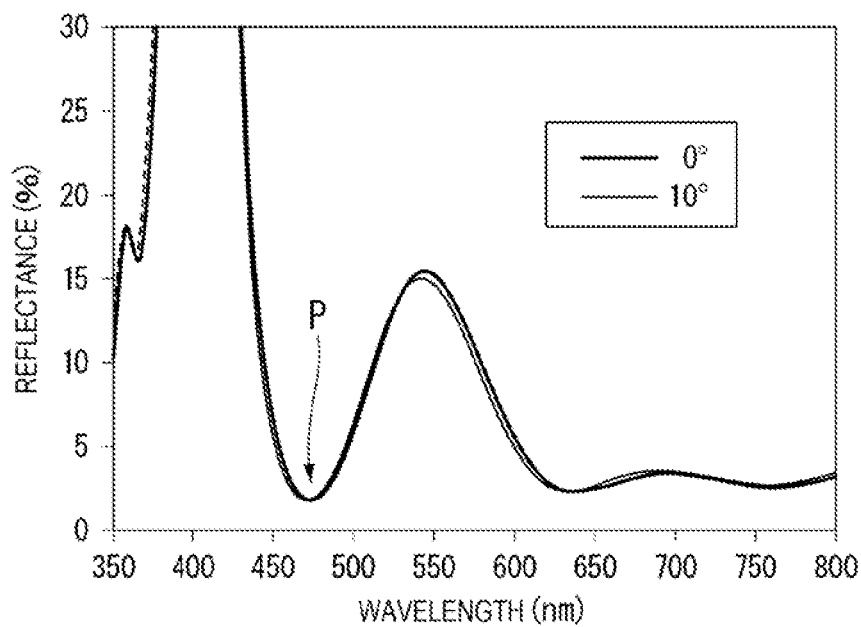
FIG. 4A shows surface reflection spectra of a second layer covering planar portions.

FIG. 4A shows surface reflection spectra of the second layer 25b covering the planar portions 43. FIG. 4A shows reflectance on the surface of the second layer 25b for light entering at a predetermined incident angle. In FIG. 4A, the horizontal axis indicates the wavelength of the light entering the second layer 25b and the vertical axis indicates the reflectance on the surface of the second layer 25b. Note that, in FIG. 4A, the reflectance of the lights entering at the incident angles of 0 degrees and 10 degrees are shown.

Figure 4B:
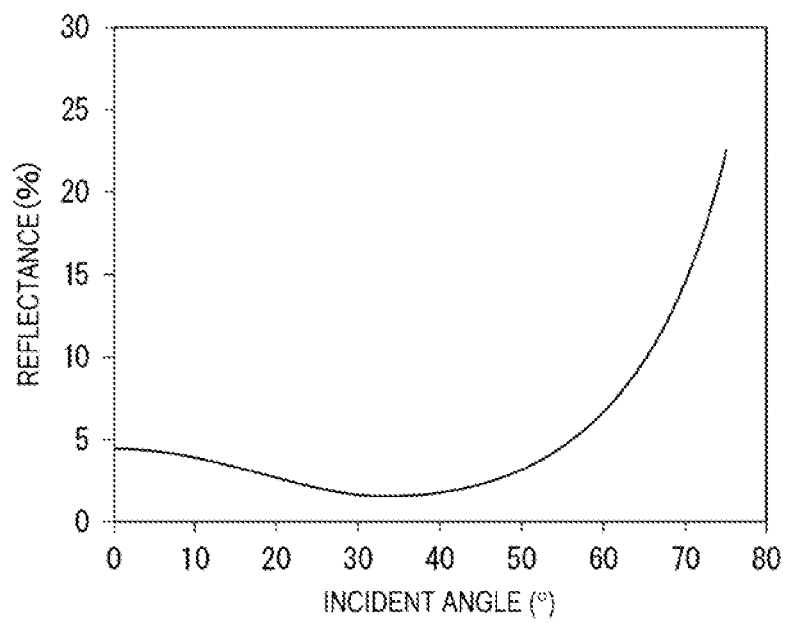
FIG. 4B shows reflectance-angle characteristics of a first light in the second layer.

FIG. 4B shows reflectance-angle characteristics of the first light B in the second layer 25b. In FIG. 4B, the horizontal axis indicates the incident angle of the first light B and the vertical axis indicates the reflectance.

In the case of the embodiment, the second layer 25b is provided on the surfaces of the planar portions 43, and accordingly, the first light B enters the surface of the second layer 25b in a perpendicular direction, e.g., in an angle distribution of 0±10 degrees. As shown in FIG. 4A, the second layer 25b of the embodiment has lower reflectance for a beam in a substantially perpendicular direction (at the incident angle of 0 degrees or 10 degrees) in the second layer 25b in the first wavelength range (450 to 460 nm) in the first light B. That is, the second layer 25b is designed to have a peak P of the reflectance for the light entering the second layer 25b from the substantially perpendicular direction in the first wavelength range. That is, the second layer 25b is designed to have the lowest reflectance for the light in the first wavelength range entering the second layer 25b from the substantially perpendicular direction. Accordingly, as shown in FIG. 4B, the second layer 25b has reflectance at about 5% for the first light B entering the second layer 25b in an angle range from 0 degrees to 10 degrees. That is, in the embodiment, the reflectance of the first light B by the second layer 25b provided on the surfaces of the planar portions 43 is about 5%.

In the embodiment, the inclination angle relative to the surfaces of the planar portions 43 on the surfaces of the structure portions 45 is set to e.g. 30 degrees. As described above, the first light B enters the surfaces of the structure portions 45 in an angle distribution of 0±10 degrees. In this regard, the first light B enters the surface of the first layer 25a provided on the structure portions 45 from a diagonal direction at an incident angle from 20 to 40 degrees.

Figure 5A:
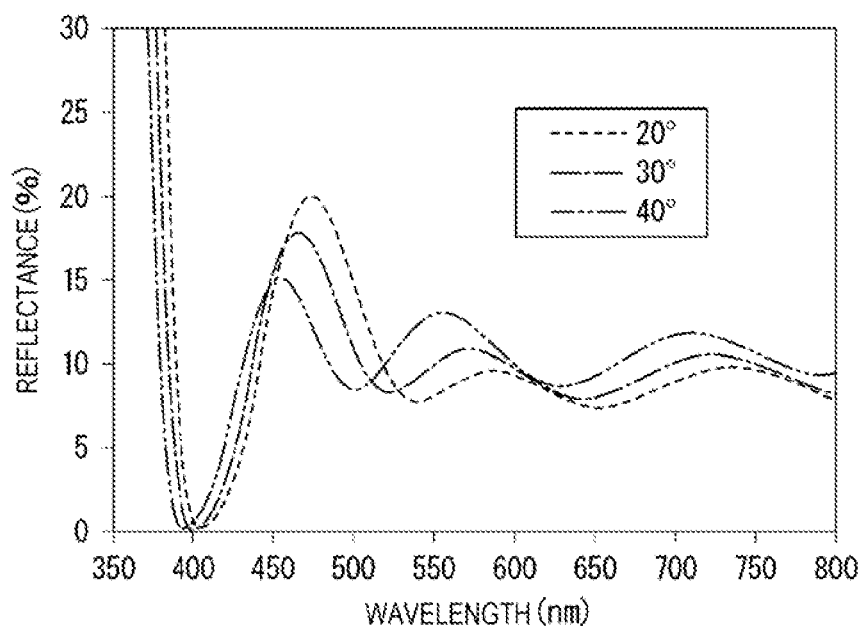
FIG. 5A shows surface reflection spectra of a first layer covering structure portions.

FIG. 5A shows surface reflection spectra of the first layer 25a covering the structure portions 45. FIG. 5A shows the reflectance by the surface of the first layer 25a for the first light B entering at the incident angle from 20 to 40 degrees. In FIG. 5A, the horizontal axis indicates the wavelength of the light entering the first layer 25a and the vertical axis indicates the reflectance on the surface of the first layer 25a. Note that, in FIG. 5A, the reflectance of the lights entering at the incident angles of 20 degrees, 30 degrees, and 40 degrees are respectively shown.

Figure 5B:
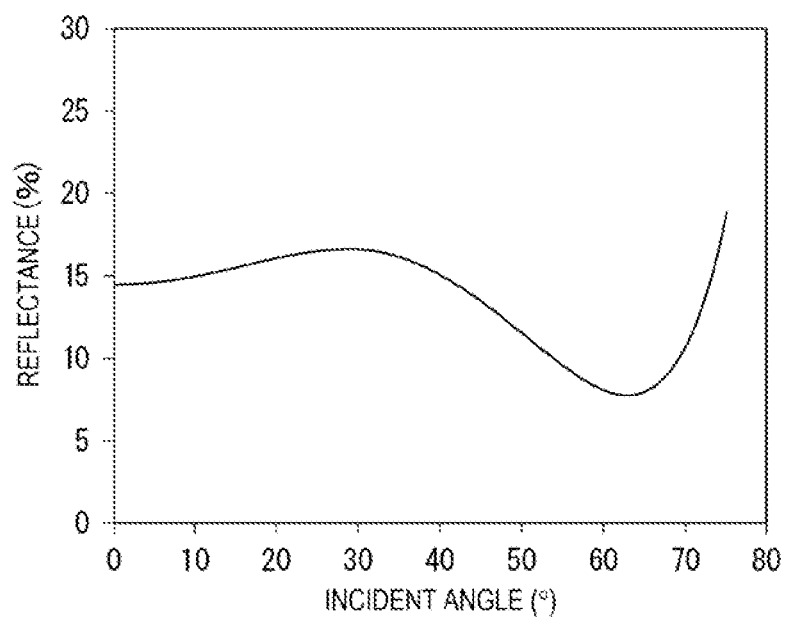
FIG. 5B shows reflectance-angle characteristics of the first light in the first layer.

FIG. 5B shows reflectance-angle characteristics of the first light B in the first layer 25a. In FIG. 5B, the horizontal axis indicates the incident angle of the first light B and the vertical axis indicates the reflectance.

Generally, the dielectric multilayer film as the material forming the half mirror layer 25 has a property that the reflection spectrum shifts toward the shorter wavelength side as the film thickness is smaller. Further, the dielectric multilayer film has a property that the reflection spectrum shifts toward the shorter wavelength side for the light entering from a diagonal direction.

In the case of the embodiment, the first layer 25a has the smaller film thickness than the second layer 25b as described above. Further, the first light B enters the first layer 25a from the diagonal direction. Accordingly, the reflection spectrum of the first light B in the first layer 25a shifts toward the shorter wavelength side than the reflection spectrum of the first light B in the second layer 25b.

As shown in FIG. 4A, the reflection spectrum in the second layer 25b has the lowest reflectance for the first light B in the first wavelength range (450 to 460 nm). Accordingly, the wavelength range of the light having the lowest reflectance in the first layer 25a shifts toward a lower wavelength range than the first wavelength range. As shown in FIG. 5A, the wavelength range of the light having the lowest reflectance in the first layer 25a is about 400 nm which is lower than the first wavelength range. That is, the reflectance for the first light B having the first wavelength range in the first layer 25a is higher than the reflectance for the first light B in the second layer 25b.

As shown in FIG. 5B, in the embodiment, the first layer 25a has the reflectance for the first light B entering the first layer 25a in the angle range from 20 degrees to 40 degrees at about 16%.

As described above, the half mirror layer 25 of the embodiment sets the wavelength range having the lowest reflectance for the light entering the planar portions 43 to correspond to the first light B and shifts the reflection spectrum of the light entering the structure portions 45 toward the shorter wavelength side, and thereby, the reflectance for the first light B in the first layer 25a is made larger than the reflectance for the first light B in the second layer 25b.

Figure 6A:
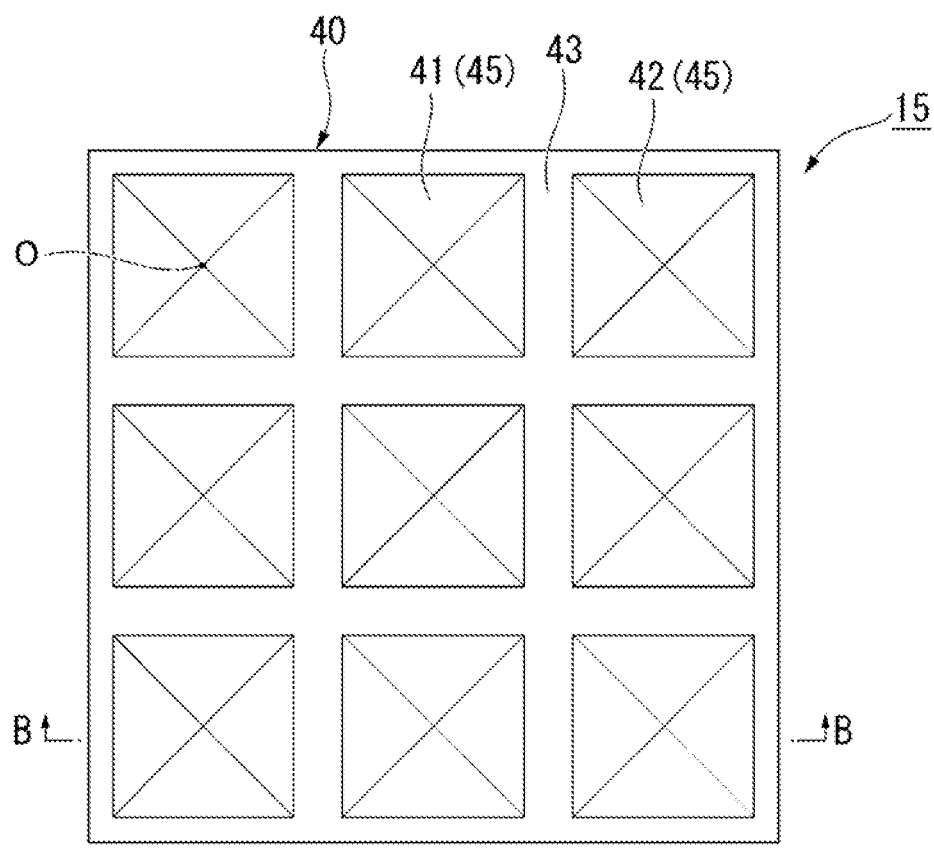
FIG. 6A is an enlarged plan view of a main part for explanation of the first light reflected by the wavelength conversion element.
Figure 6B:
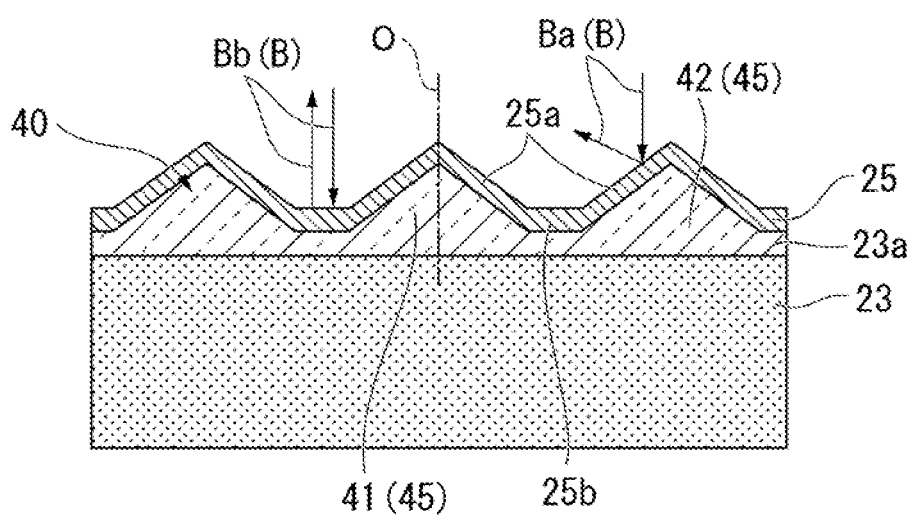
FIG. 6B is an enlarged sectional view of a main part along line B-B in a direction of an arrow in FIG. 6A.

FIGS. 6A and 6B are enlarged views of main parts for explanation of the first light B reflected by the wavelength conversion element 15. In FIGS. 6A and 6B, an axis passing through the center of the structure portion 45 in the quadrangular pyramid shape is referred to as "center axis O". FIG. 6A is a plan view showing a configuration of a main part of the wavelength conversion element 15, and FIG. 6B is a sectional view taken along line B-B in a direction of an arrow in FIG. 6A passing through the center axis O of the structure portion 45. Note that, in FIG. 6A, to facilitate visualization, the half mirror layer 25 is omitted. In the following description, of the first light B entering the structure 40 provided on the upper surface 23a of the wavelength conversion layer 23, a component entering the structure portion 45 is referred to as "first light Ba" and a component entering the planar portion 43 is referred to as "first light Bb".

The wavelength conversion element 15 of the embodiment has higher reflectance of the structure portions 45 than that of the planar portions 43 as described above. Therefore, as shown in FIGS. 6A and 6B, according to the wavelength conversion element 15 of the embodiment, of the first light B entering the structure 40 provided on the upper surface 23a of the wavelength conversion layer 23, a larger amount of the first lights Ba entering the structure portions 45 may be reflected and a smaller amount of the first lights Bb entering the planar portions 43 may be reflected.

As shown in FIG. 6B, the surface of the structure portion 45 is the inclined surface relative to the surface of the planar portion 43, and the first light Ba entering the structure portion 45 is reflected toward a diagonal direction apart from the perpendicular direction. That is, the wavelength conversion element 15 of the embodiment scatters and reflects the first light B in a larger amount in the diagonal direction than that in the perpendicular direction.

In the case of the embodiment, the structure portion 45 has the quadrangular pyramid shape and directions in which the four side surfaces face are different by 90 degrees as seen from the direction along the center axis O. Accordingly, the structure portion 45 isotropically scatter-reflects the first light Ba in the four directions around the center axis O.

Hereinafter, the first light B scatter-reflected from the wavelength conversion element 15 is referred to as "scatter-reflected light".

Figure 7:
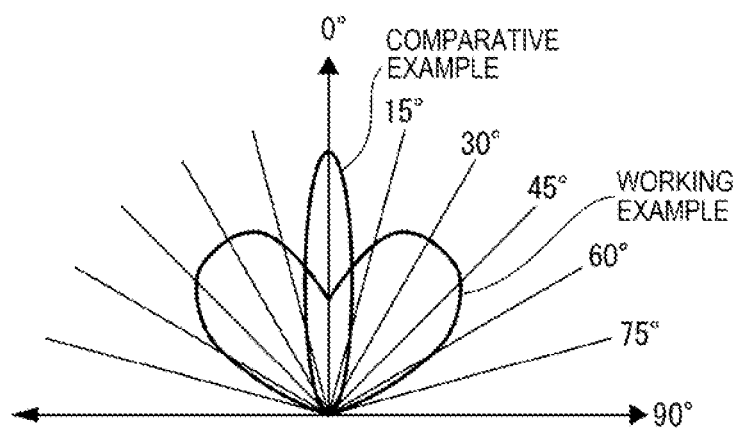
FIG. 7 shows orientation characteristics of scatter-reflected lights by the wavelength conversion element.

FIG. 7 shows orientation characteristics of scatter-reflected lights B1 by the wavelength conversion element 15 of the embodiment. In FIG. 7, the vertical axis defines an orientation distribution in the 0-degree direction in the scatter-reflected light B1 and the horizontal axis direction defines an orientation distribution in the ±90-degree directions in the scatter-reflected lights B1. Note that, in FIG. 7, the orientation characteristics of the wavelength conversion element 15 of the embodiment are shown as a working example, and the orientation characteristics of a wavelength conversion element in which only the structure 40 is provided, but the half mirror layer 25 is not provided on the upper surface 23a of the wavelength conversion layer 23 are shown as a comparative example.

As shown in FIG. 7, it is known that, in the wavelength conversion element of the comparative example, the orientation distribution of the scatter-reflected light B1 is substantially equal over the entire range in a diagonal direction from the 0-degree direction in a range from 15 to 60 degrees.

On the other hand, it is known that, in the wavelength conversion element 15 of the embodiment, as the scatter-reflected light B1, the light having the orientation distribution containing a larger amount of components in the diagonal direction in the range from 15 to 60 degrees than that in the perpendicular direction along the 0-degree direction is output.

As described above, according to the wavelength conversion element 15 of the embodiment, as shown in FIG. 3, the scatter-reflected light B1 may be reflected in the larger amount in the diagonal direction than that in the perpendicular direction. Note that, in FIG. 3, for clear illustration, the luminous flux widths of the scatter-reflected lights B1 in the diagonal directions are thicker than that in the perpendicular direction.

The structure 40 of the embodiment is formed using a material having lower light absorption, and the reflection of the second light Y by the surface of the structure 40 is suppressed. Therefore, in the wavelength conversion element 15 of the embodiment, the second light Y generated in the wavelength conversion layer 23 is transmitted through the structure 40 and the half mirror layer 25 and efficiently output to the outside.

According to the wavelength conversion element 15 of the embodiment, the white illumination light WL containing the scatter-reflected light B1 and the second light Y may be output toward the second optical system 14. The illumination light WL is substantially parallelized by the second optical system 14. The illumination light WL transmitted through the second optical system 14 passes through the dichroic mirror 13 placed on the illumination optical axis AX.

Here, the dichroic mirror 13 has the optical property to reflect the first light B and transmit the second light Y. Accordingly, the second light Y contained in the illumination light WL is transmitted through the dichroic mirror 13 and travels to the homogenizer illumination system 16. The second light Y is transmitted through the dichroic mirror 13, and a light loss of the second light Y by the dichroic mirror 13 may be reduced.

On the other hand, the scatter-reflected light B1 contained in the illumination light WL is the light in the same first wavelength range as the first light B, and reflected by the dichroic mirror 13. In the embodiment, the scatter-reflected light B1 contained in the illumination light WL has the orientation distribution containing the larger amount of the diagonal direction component than the perpendicular direction component as described above. Accordingly, many of the beams contained in the scatter-reflected light B1 travel toward the homogenizer illumination system. 16 to avoid the dichroic mirror 13 located in the perpendicular direction of the wavelength conversion element 15.

Thereby, the amount of the scatter-reflected light B1 entering the dichroic mirror 13 is suppressed, and the ratio of the scatter-reflected light B1 reflected by the dichroic mirror 13 and not effectively used as the illumination light WL may be reduced. Further, in the embodiment, the dichroic mirror 13 is downsized because the collected first light B is entered into the dichroic mirror 13. Accordingly, the amount of the scatter-reflected light B1 entering the dichroic mirror 13 may be further reduced.

The homogenizer illumination system 16 entered by the illumination light WL includes an optical integration system 31, a polarization conversion element 32, and a superimposing system 33. The optical integration system 31 includes a first multi-lens array 31a and a second multi-lens array 31b.

The polarization conversion element 32 includes a polarization separation film and a wave plate arranged in an array form. The polarization conversion element 32 aligns the polarization direction of the illumination light WL in a predetermined direction. Specifically, the polarization conversion element 32 aligns the polarization direction of the illumination light WL in a direction of a transmission axis of light incident-side polarizers of the light modulation devices 4R, 4G, 4B.

Thereby, the polarization directions of the red light LR, the green light LG, and the blue light LB obtained by separation of the illumination light WL transmitted through the polarization conversion element 32 coincide with the transmission axis directions of the light incident-side polarizers of the respective light modulation devices 4R, 4G, 4B. Accordingly, the red light LR, the green light LG, and the blue light LB are not respectively blocked by the light incident-side polarizers, but respectively enter the image formation areas of the light modulation devices 4R, 4G, 4B.

The superimposing system 33 forms images of the respective small lenses of the first multi-lens array 31a near the respective image formation areas of the light modulation devices 4R, 4G, 4B with the second multi-lens array 31b.

According to the illumination device 2 of the embodiment, the light use efficiency of the illumination light WL may be improved, and the brightness of the illumination light WL may be improved, power consumption may be reduced, or heat generation within the device due to a light loss may be suppressed.

Effects

The wavelength conversion element 15 of the embodiment includes the substrate 21, the reflection layer 22 provided on the upper surface 21a of the substrate 21, the wavelength conversion layer 23 provided to face the reflection layer 22 and converting the first light B in the first wavelength range into the second light Y in the second wavelength range different from the first wavelength range, the structure 40 provided to face the wavelength conversion layer 23 and scattering a part of the first light B in the first wavelength range, and the half mirror layer 25 provided to face the structure 40, reflecting a part of the first light B in the first wavelength range, transmitting another part of the first light B in the first wavelength range, and transmitting the second light Y in the second wavelength range, wherein the structure 40 includes the first structure portions 41, the second structure portions 42, and the planar portions 43 provided between the first structure portions 41 and the second structure portions 42, the first layer 25a provided on the first structure portions 41 and the second structure portions 42 has the first reflectance for the first light B in the first wavelength range, the second layer 25b provided on the planar portions 43 has the second reflectance different from the first reflectance for the first light B in the first wavelength range. In the embodiment, the first reflectance is higher than the second reflectance.

In the wavelength conversion element 15 of the embodiment, the first reflectance in the first layer 25a is higher than the second reflectance in the second layer 25b. Thereby, the structure 40 generates the scatter-reflected light B1 having the orientation distribution containing more components toward the diagonal direction than those in the perpendicular direction. The scatter-reflected light B1 travels to avoid the dichroic mirror 13. Therefore, according to the wavelength conversion element 15 of the embodiment, the light use efficiency of the first light B may be improved by reduction of the light loss by the dichroic mirror 13.

In the wavelength conversion element 15 of the embodiment, in the half mirror layer 25, the first layer 25a provided on the first structure portions 41 and the second structure portions 42 has the first film thickness and the second layer 25b provided on the planar portions 43 has the second film thickness, and the first film thickness is smaller than the second film thickness.

In the first layer 25a having the smaller film thickness, the reflection spectrum of the first light B shifts to the shorter wavelength side. Thereby, the configuration in which the first reflectance in the first layer 25a is made higher than the second reflectance in the second layer 25b may be realized. Therefore, as described above, the scatter-reflected light B1 having the orientation distribution containing more components in the diagonal direction than those in the perpendicular direction as described above may be generated.

In the wavelength conversion element 15 of the embodiment, the first structure portions 41 and the second structure portions 42 have the quadrangular pyramid shapes.

According to the first structure portions 41 and the second structure portions 42 having the quadrangular pyramid shapes, the scatter-reflected lights B1 by isotropic scatter reflection of the first light B may be generated.

In the wavelength conversion element 15 of the embodiment, the structure 40 is formed using the material having the refractive index in the range from 1.3 to 2.5.

According to the configuration, the structure 40 may be formed using the material having lower light absorption and chemical stability.

In the wavelength conversion element 15 of the embodiment, the half mirror layer 25 includes the dielectric multilayer film.

According to the configuration, the half mirror layer 25 with suppressed light absorption may be formed.

In the wavelength conversion element 15 of the embodiment, the dielectric multilayer film may contain one of $MgF_2$, $SiO_2$, $Al_2O_3$, $Y_2O_3$, $CeO_2$, $HfO_2$, $La_2O_3$, $ZrO_2$, $Ta_2O_5$, $Nb_2O_5$, and $TiO_2$.

According to the configuration, the chemically stable half mirror layer 25 with suppressed light absorption may be formed.

The illumination device 2 of the embodiment includes the above described wavelength conversion element 15, the light source 11 outputting the first light B in the first wavelength range, and the dichroic mirror 13 reflecting the first light B in the first wavelength range output from the light source 11 toward the wavelength conversion element 15.

According to the illumination device 2 of the embodiment, the amount of the scatter-reflected light B1 entering the dichroic mirror 13 is suppressed, and thereby, the light use efficiency of the illumination light WL may be improved.

In the illumination device 2 of the embodiment, the dichroic mirror 13 may transmit the second light Y in the second wavelength range.

According to the configuration, the light loss of the second light Y by the dichroic mirror 13 may be reduced.

The projector 1 of the embodiment includes the illumination device 2, the light modulation devices 4R, 4G, 4B modulating the light from the illumination device 2 according to the image information, and the projection optical device 6 projecting the light modulated by the light modulation devices 4R, 4G, 4B.

According to the projector 1 of the embodiment, the illumination device 2 with the improved light use efficiency of the illumination light WL is provided, and the projector with higher light efficiency displaying bright images may be provided.

Note that the technical scope of the present disclosure is not limited to the above described embodiment, but various changes can be made without departing from the scope of the present disclosure.

Figure 8:
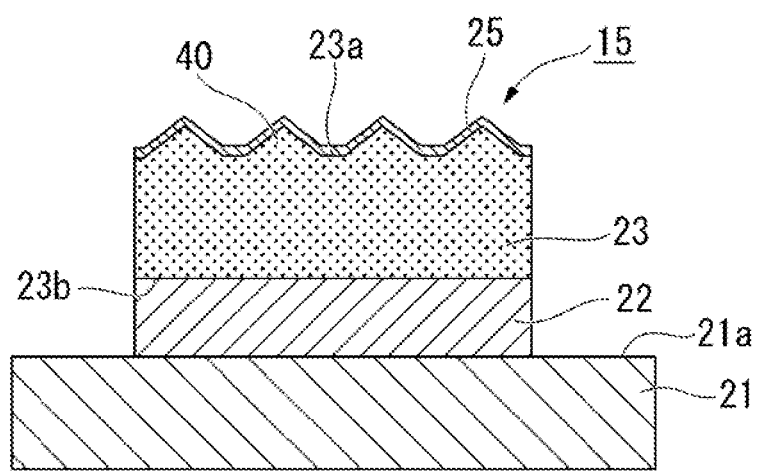
FIG. 8 shows a configuration in which a structure and a wavelength conversion layer are integrally formed.

For example, in the above described embodiment, the structure 40 is formed separately from the wavelength conversion layer 23, however, the structure 40 may be formed integrally with the wavelength conversion layer 23. FIG. 8 shows a configuration in which the structure 40 and the wavelength conversion layer 23 are integrally formed. As shown in FIG. 8, according to the configuration in which the structure 40 is directly formed on the upper surface 23a of the wavelength conversion layer 23, the step of forming the structure 40 may be eliminated and the cost of the wavelength conversion element 15 may be reduced. Further, the structure and the wavelength conversion layer 23 have the same refractive index and no interfacial reflection is produced between the structure 40 and the wavelength conversion layer 23, and thereby, the light is harder to travel in the lateral directions and etendue may be consequently reduced.

The shapes of the structure portions 45 are not limited to the quadrangular pyramid shapes, but may be convex lens shapes or concave lens shapes. Alternatively, in the structure 40 of the above described embodiment, the plurality of structure portions 45 having the same shape are placed at equal pitches, however, the structure portions 45 having the same or different shapes may be randomly placed to form the structure 40. Alternatively, in the structure portions 45, the shapes of the first structure portions 41 and the second structure portions 42 may be made different.

In the above described embodiment, the wavelength conversion element 15 employs the fixed structure in which the wavelength conversion layer 23 is stationary relative to the first light B, however, may employ a wheel structure in which the wavelength conversion layer 23 rotates relative to the first light B.

In addition, the specific description of the shapes, the numbers, the placements, the materials, etc. of the respective component elements of the illumination device and the projector is not limited to those in the above described embodiment, but can be appropriately changed. In the above described embodiment, the example in which the illumination device according to the present disclosure is provided in the projector using the liquid crystal light valves is shown, however, the present disclosure is not limited to that. The illumination device according to the present disclosure may be applied to a projector using a digital micromirror device as the light modulation device. Alternatively, the projector does not necessarily have a plurality of light modulation devices, but may have only one light modulation device.

In the above described embodiment, the example in which the illumination device according to the present disclosure is applied to the projector is shown, however, the present disclosure is not limited to that. The illumination device according to the present disclosure may be applied to a lighting device, a headlight of an automobile, or the like.

A wavelength conversion element according to an aspect of the present disclosure may have the following configuration.

A wavelength conversion element according to an aspect of the present disclosure includes a substrate, a reflection layer provided on the substrate, a wavelength conversion layer provided in the reflection layer and converting a light in a first wavelength range into a light in a second wavelength range different from the first wavelength range, a structure provided in the wavelength conversion layer and scattering a part of the light in the first wavelength range, and an optical layer provided in the structure, reflecting a part of the light in the first wavelength range, transmitting another part of the light in the first wavelength range, and transmitting the light in the second wavelength range, wherein the structure includes a first structure portion, a second structure portion, and a planar portion provided between the first structure portion and the second structure portion, the optical layers provided in the first structure portion and the second structure portion have first reflectance for the light in the first wavelength range and the optical layer provided in the planar portion has second reflectance different from the first reflectance for the light in the first wavelength range.

In the wavelength conversion element according to the aspect of the present disclosure, the first reflectance may be higher than the second reflectance.

In the wavelength conversion element according to the aspect of the present disclosure, the optical layers provided in the first structure portion and the second structure portion may have a first film thickness, the optical layer provided in the planar portion may have a second film thickness different from the first film thickness, and the first film thickness may be smaller than the second film thickness.

In the wavelength conversion element according to the aspect of the present disclosure, the first structure portion and the second structure portion may have quadrangular pyramid shapes.

In the wavelength conversion element according to the aspect of the present disclosure, the structure may be formed using a material having a refractive index in a range from 1.3 to 2.5.

In the wavelength conversion element according to the aspect of the present disclosure, the optical layer may include a dielectric multilayer film.

In the wavelength conversion element according to the aspect of the present disclosure, the dielectric multilayer film may contain one of $MgF_2$, $SiO_2$, $Al_2O_3$, $Y_2O_3$, $CeO_2$, $HfO_2$, $La_2O_3$, $ZrO_2$, $Ta_2O_5$, $Nb_2O_5$, and $TiO_2$.

In the wavelength conversion element according to the aspect of the present disclosure, the structure may be formed integrally with the wavelength conversion layer.

An illumination device according to an aspect of the present disclosure may have the following configuration.

An illumination device according to an aspect of the present disclosure includes the above described wavelength conversion element, a light source outputting the light in the first wavelength range, and a reflection member reflecting the light in the first wavelength range output from the light source toward the wavelength conversion element.

In the illumination device according to the aspect of the present disclosure, the reflection member may transmit the light in the second wavelength range.

A projector according to an aspect of the present disclosure may have the following configuration.

A projector according to an aspect of the present disclosure includes the illumination device according to the aspect of the present disclosure, a light modulation device modulating the light from the illumination device according to image information, and a projection optical device projecting the light modulated by the light modulation device.

What is claimed is:

1. A wavelength conversion element comprising:
a substrate;
a reflection layer provided on the substrate;
a wavelength conversion layer provided in the reflection layer and converting a light in a first wavelength range into a light in a second wavelength range different from the first wavelength range;
a structure provided in the wavelength conversion layer and scattering a part of the light in the first wavelength range; and
an optical layer provided on the structure, reflecting a part of the light in the first wavelength range, transmitting another part of the light in the first wavelength range, and transmitting the light in the second wavelength range, wherein
the structure includes a first structure portion, a second structure portion, and a planar portion provided between the first structure portion and the second structure portion,
the optical layer provided on the first structure portion and the second structure portion has a first reflectance for the light in the first wavelength range,
the optical layer provided on the planar portion has a second reflectance different from the first reflectance for the light in the first wavelength range,
the optical layer provided on the first structure portion and the second structure portion has a first film thickness, and
the optical layer provided on the planar portion has a second film thickness different from the first film thickness, and the first film thickness is smaller than the second film thickness.

2. The wavelength conversion element according to claim 1, wherein
the first reflectance is higher than the second reflectance.

3. The wavelength conversion element according to claim 1, wherein the first structure portion and the second structure portion have quadrangular pyramid shapes.

4. The wavelength conversion element according to claim 1, wherein
the structure is formed using a material having a refractive index in a range from 1.3 to 2.5.

5. The wavelength conversion element according to claim 1, wherein
the optical layer includes a dielectric multilayer film.

6. The wavelength conversion element according to claim 5, wherein
the dielectric multilayer film contains one of $MgF_2$, $SiO_2$, $Al_2O_3$, $Y_2O_3$, $CeO_2$, $HfO_2$, $La_2O_3$, $ZrO_2$, $Ta_{205}$, $Nb_2O_5$, and $TiO_2$.

7. The wavelength conversion element according to claim 1, wherein
the structure is formed integrally with the wavelength conversion layer.

8. An illumination device comprising:
the wavelength conversion element according to claim 1;
a light source outputting the light in the first wavelength range; and
a reflection member reflecting the light in the first wavelength range output from the light source toward the wavelength conversion element.

9. The illumination device according to claim 8, wherein
the reflection member transmits the light in the second wavelength range.

10. A projector comprising:
the illumination device according to claim 8;
a light modulation device modulating the light from the illumination device according to image information; and
a projection optical device projecting the light modulated by the light modulation device.

* * * * *